(12) United States Patent
Yoshida et al.

(10) Patent No.: US 8,426,832 B2
(45) Date of Patent: Apr. 23, 2013

(54) CELL PROJECTION CHARGED PARTICLE BEAM LITHOGRAPHY

(75) Inventors: Kenji Yoshida, Tokyo (JP); Takashi Mitsuhashi, Kanagawa (JP); Shohei Matsushita, Kanagawa (JP); Larry Lam Chau, Fremont, CA (US); Tam Dinh Thanh Nguyen, Fremont, CA (US); Donald MacMillen, Hillsborough, CA (US); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 731 days.

(21) Appl. No.: 12/552,373

(22) Filed: Sep. 2, 2009

(65) Prior Publication Data

US 2009/0325085 A1    Dec. 31, 2009

Related U.S. Application Data

(63) Continuation-in-part of application No. 11/603,441, filed on Nov. 21, 2006, now Pat. No. 7,772,575.

(60) Provisional application No. 61/095,606, filed on Sep. 9, 2008.

(51) Int. Cl.
*G03F 1/00* (2012.01)

(52) U.S. Cl.
USPC ............ 250/492.22; 250/492.2; 250/492.23; 430/296; 430/5; 716/52

(58) Field of Classification Search ............ 250/492.2, 250/492.22, 492.23; 430/296, 5; 716/52
See application file for complete search history.

(56) References Cited

U.S. PATENT DOCUMENTS

| | | | |
|---|---|---|---|
| 5,256,881 A * | 10/1993 | Yamazaki et al. | ....... 250/492.23 |
| 5,424,173 A | 6/1995 | Wakabayashi et al. | |
| 5,459,771 A | 10/1995 | Richardson et al. | |
| 5,986,292 A | 11/1999 | Mizuno et al. | |
| 6,037,820 A | 3/2000 | Ishizaka | |

(Continued)

FOREIGN PATENT DOCUMENTS

| | | |
|---|---|---|
| EP | 0364929 A2 | 4/1990 |
| EP | 0518783 A1 | 12/1992 |

(Continued)

OTHER PUBLICATIONS

International Search Report and Written Opinion dated Mar. 13, 2008 for PCT/US2007/085135.

(Continued)

*Primary Examiner* — Michael Logie
(74) *Attorney, Agent, or Firm* — The Mueller Law Office, P.C.

(57) ABSTRACT

The present invention increases the number of characters available on a stencil for charged particle beam lithography. A stencil for charged particle beam lithography is disclosed, comprising two character projection (CP) characters, wherein the blanking areas for the two CP characters overlap. A stencil is also disclosed comprising two CP characters with one or more optional characters between the two characters, wherein the optional characters can form meaningful patterns on a surface only in combination with one of the two characters. A stencil is also disclosed wherein the blanking area of a CP character extends beyond the boundary of the stencil's available character area. Methods for design of the aforementioned stencils are also disclosed.

12 Claims, 10 Drawing Sheets

U.S. PATENT DOCUMENTS

| | | |
|---|---|---|
| 6,511,048 B1 | 1/2003 | Sohda et al. |
| 6,560,768 B2 | 5/2003 | Inanami et al. |
| 6,756,159 B2 * | 6/2004 | Inanami .................... 430/5 |
| 7,579,606 B2 | 8/2009 | Yoshida et al. |
| 7,772,575 B2 * | 8/2010 | Yoshida et al. ......... 250/492.23 |
| 7,777,204 B2 * | 8/2010 | Lapanik et al. ......... 250/492.22 |
| 2001/0046631 A1 | 11/2001 | Fujiwara et al. |
| 2002/0162088 A1 * | 10/2002 | Inanami et al. ................ 716/19 |
| 2002/0175298 A1 | 11/2002 | Moniwa et al. |
| 2002/0179856 A1 | 12/2002 | Ito et al. |
| 2005/0242303 A1 | 11/2005 | Platzgummer |
| 2006/0033048 A1 | 2/2006 | Maruyama et al. |
| 2007/0125967 A1 * | 6/2007 | Lapanik et al. ......... 250/492.22 |
| 2008/0116397 A1 | 5/2008 | Yoshida et al. |
| 2008/0116398 A1 | 5/2008 | Hara et al. |
| 2008/0118852 A1 | 5/2008 | Mitsuhashi |
| 2008/0120073 A1 | 5/2008 | Hara et al. |
| 2008/0203324 A1 | 8/2008 | Fujimura et al. |
| 2008/0305043 A1 | 12/2008 | Gregory et al. |

FOREIGN PATENT DOCUMENTS

| | | |
|---|---|---|
| JP | 05036592 | 2/1993 |
| JP | 2000195781 A | 7/2000 |
| JP | 2001274071 A | 10/2001 |
| JP | 2001274077 A | 10/2001 |
| JP | 2002252158 A | 9/2002 |
| JP | 2002289511 A | 10/2002 |
| JP | 2003309054 A | 10/2003 |
| JP | 2006054228 A | 2/2006 |
| JP | 2006165146 A | 6/2006 |

OTHER PUBLICATIONS

Lapanik, D., U.S. Appl. No. 11/226,253, filed Sep. 15, 2006.
Notice of Allowance, mailed on May 12, 2010 for U.S. Appl. No. 11/603,441.
Non-Final Office Action, mailed on Jan. 28, 2010 for U.S. Appl. No. 11/603,441.
Final Office Action, mailed on Nov. 3, 2009 for U.S. Appl. No. 11/603,441.
Non-Final Office Action, mailed on Dec. 30, 2008 for U.S. Appl. No. 11/603,441.
Extended European Search Report dated Dec. 4, 2009 for U.S. Appl. No. 11/603,441.
Office Action dated Dec. 30, 2008 for U.S. Appl. No. 11/603,441.
Office Action dated Nov. 3, 2008 for U.S. Appl. No. 11/603,441.
European Office Action dated Aug. 21, 2012 for EP Application No. 07 864 589.2.
Japanese Office Action dated Oct. 2, 2012 for Japanese application No. 2009-538472.

* cited by examiner

CELL PROJECTION CHARGED PARTICLE BEAM LITHOGRAPHY

RELATED APPLICATIONS

This application: 1) is a continuation-in-part of U.S. patent application Ser. No. 11/603,441 filed Nov. 21, 2006, entitled "Stencil Design And Method For Cell Projection Particle Beam Lithography"; and 2) claims priority from U.S. Provisional Patent Application Ser. No. 61/095,606 filed Sep. 9, 2008, entitled "Stencil Having Improved Character Density For Character Projection Lithography"; both of which are hereby incorporated by reference for all purposes.

BACKGROUND OF THE DISCLOSURE

The present disclosure is related to lithography, and more particularly to the design and manufacture of a stencil having improved character density for character projection charged particle beam lithography.

In the production or manufacturing of semiconductor devices, such as integrated circuits or chips, optical lithography or photolithography may be used to fabricate the semiconductor devices. Optical lithography is a printing process in which a lithographic mask or reticle is used to transfer patterns to a substrate such as a semiconductor or silicon wafer to create the integrated circuit. Other substrates could include flat panel displays or even photomasks. Also, extreme ultraviolet (EUV) or X-ray lithography are considered types of optical lithography. The reticle may contain a circuit pattern corresponding to an individual layer of the integrated circuit and this pattern can be imaged onto a certain area on the substrate that has been coated with a layer of radiation-sensitive material known as photoresist or resist. Once the patterned layer is transferred the layer may undergo various other processes such as etching, ion implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

There are a number of technologies used for forming patterns on a reticle, including using optical or charged particle beam systems. The most commonly used system is the variable shape beam (VSB) type, where a precise electron beam is shaped and steered onto a resist-coated surface of the reticle. These shapes are simple shapes, usually limited to rectangles of certain minimum and maximum sizes and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. A second type of system is a character projection system. In this case there is a stencil in the system that has in it a variety of shapes which may be rectilinear, arbitrary-angled linear, circular, annular, part circular, part annular, or arbitrary curvi-linear shapes, and may be a connected set of complex shapes or a group of disjointed sets of connected sets of complex shapes. An electron beam can be shot through the stencil to efficiently produce more complex patterns (i.e., characters) on the reticle. In theory, such a system could be faster than a VSB system because it can shoot more complex shapes with each time-consuming shot. Thus, an E shot with a VSB system takes four shots, but could be done with one shot with a character projection system. Note that shaped beam systems can be thought of as a special (simple) case of character projection, where the characters are just simple characters, usually rectangles or 45-45-90 triangles. It is also possible to partially expose a character. This can be done by, for instance, blocking part of the particle beam. For example, the E described above can be partially exposed as an F or an I, where different parts of the beam are cut off by an aperture. For a very complex reticle, one must fracture the pattern into nearly billions and sometimes approaching trillions of elemental shapes. There are, for instance, simple rectangular shapes for a VSB system or a limited number of characters in a character projection system. The more total instances of elemental shapes (characters) in the pattern, the longer and more expensive the write time. Character projection systems can therefore be faster than VSB system because the use of complex characters as elemental shapes allows the number of elemental shapes to be lower than when using simple VSB shapes. However, the number of characters that can be made available among which the selection of characters by the projection machine takes minimal time is limited, today only allowing about 10-1000 characters. Circuit patterns for which no stencil character exists must be written by VSB. The limit on the number of available stencil characters limits the performance of character projection particle beam systems.

It would be advantageous to reduce the time and expense it takes to prepare and manufacture a reticle that is used for a substrate. More generally, it would be advantageous to reduce the time and expense it takes to prepare and manufacture any surface, including the surface of a wafer, such as when using maskless direct write. As discussed more fully herein, this can be accomplished by methods which allow an increase in the number of available characters on a stencil.

SUMMARY OF THE DISCLOSURE

The present invention increases character density on a stencil by overlapping character projection blanking areas and CP characters. In one form of the present disclosure, a stencil for charged particle beam lithography is disclosed which comprises a first character having a first blanking area, and a second character having a second blanking area, wherein the two blanking areas overlap each other.

In another form of the present disclosure, a stencil for charged particle beam lithography is disclosed which comprises two characters and one or more optional characters between the two characters, such that the optional characters can form meaningful patterns on a surface only in combination with one of the two characters.

In another form of the present disclosure, a stencil for charged particle beam lithography is disclosed in which a character is placed at or near the boundary of the stencil's available area, such that a portion of the blanking area is outside of the available character area of the stencil.

These and other advantages of the present disclosure will become apparent after considering the following detailed specification in conjunction with the accompanying drawings.

DETAILED DESCRIPTION OF THE EMBODIMENTS

Figure 1:
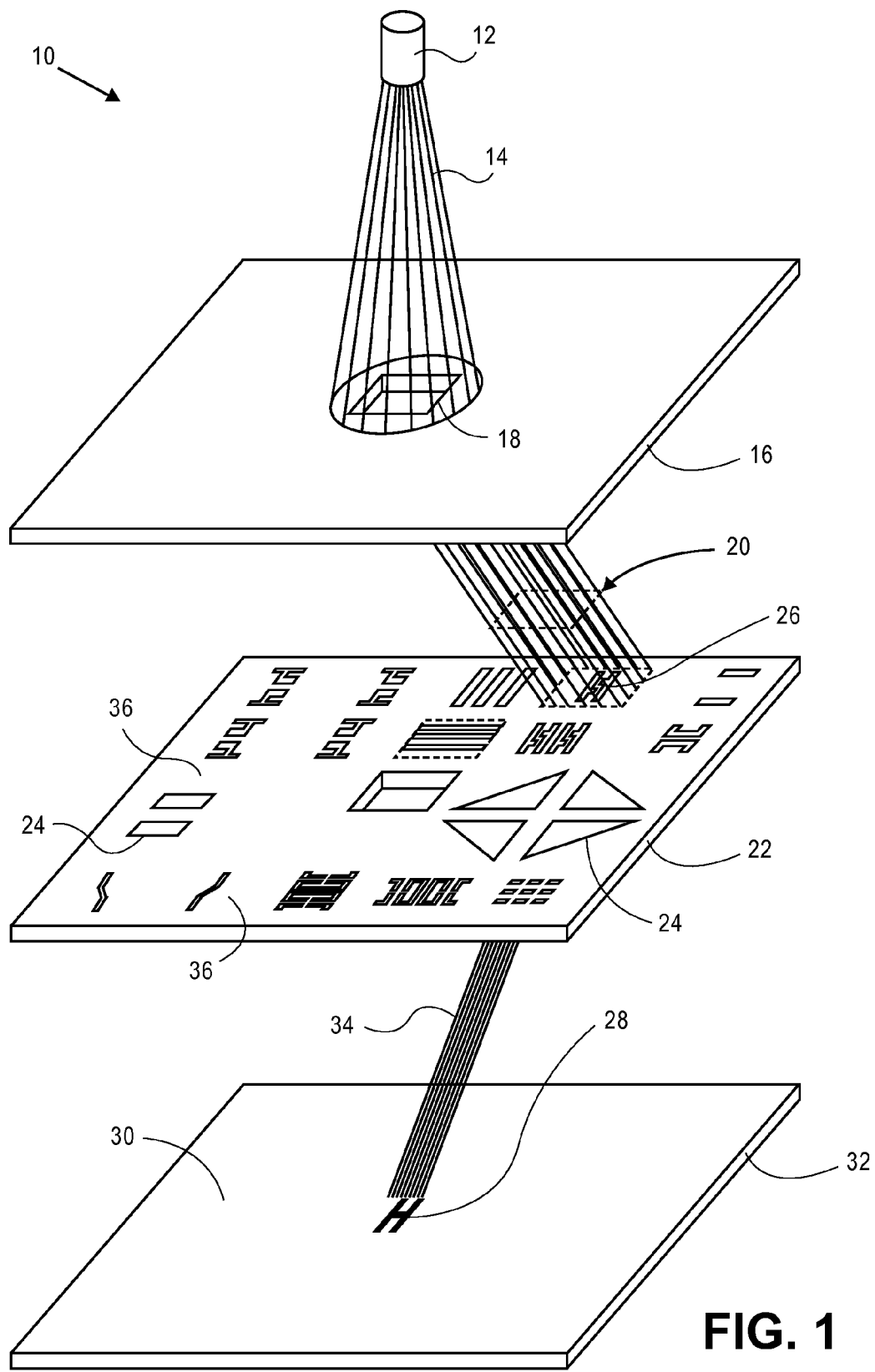
FIG. 1 illustrates a character projection charged particle beam system used to manufacture a surface.

Referring now to the drawings, wherein like numbers refer to like items, FIG. 1 illustrates an embodiment of a lithography system, such as a charged particle beam writer system, in this case a CP type electron beam writing device 10. The electron beam writer system 10 has an electron beam source 12 that projects an electron beam 14 toward a first shaping aperture plate 16. The plate 16 has an aperture 18 formed therein which allows the electron beam 14 to pass. Once the electron beam 14 passes through the aperture 18 it is directed or deflected by a system of lenses and deflectors (not shown) as a rectangular-shaped electron beam 20 toward a second shaping aperture plate or stencil 22. The stencil 22 has formed therein a number of openings or apertures 24 that define various types of characters 26. Each character 26 formed in the stencil 22 may be used to form a pattern 28 on a surface 30 of a substrate 32, such as a silicon wafer, a reticle or other substrate. An electron beam 34 emerges from one of the characters 26 and is directed by a system of lenses and deflectors (not shown) onto the surface 30 as the pattern 28, which is depicted as being in the shape of the letter "H". The pattern 28 is drawn by using one shot of the electron beam system 10. This reduces the overall writing time to complete the pattern 28 as compared to using a variable shape beam (VSB) projection system or method. The pattern 28 written on the surface 30 is generally a significantly reduced in size or demagnified version of the character 26. Although one aperture 18 is shown being formed in the plate 16, it is possible that there may be more than one aperture in the plate 16. Although two plates 16 and 22 are shown in this example, there may be only one plate or more than two plates, each plate comprising one or more apertures. The present invention is applicable in any CP-type charged particle beam writer system.

Figure 2:
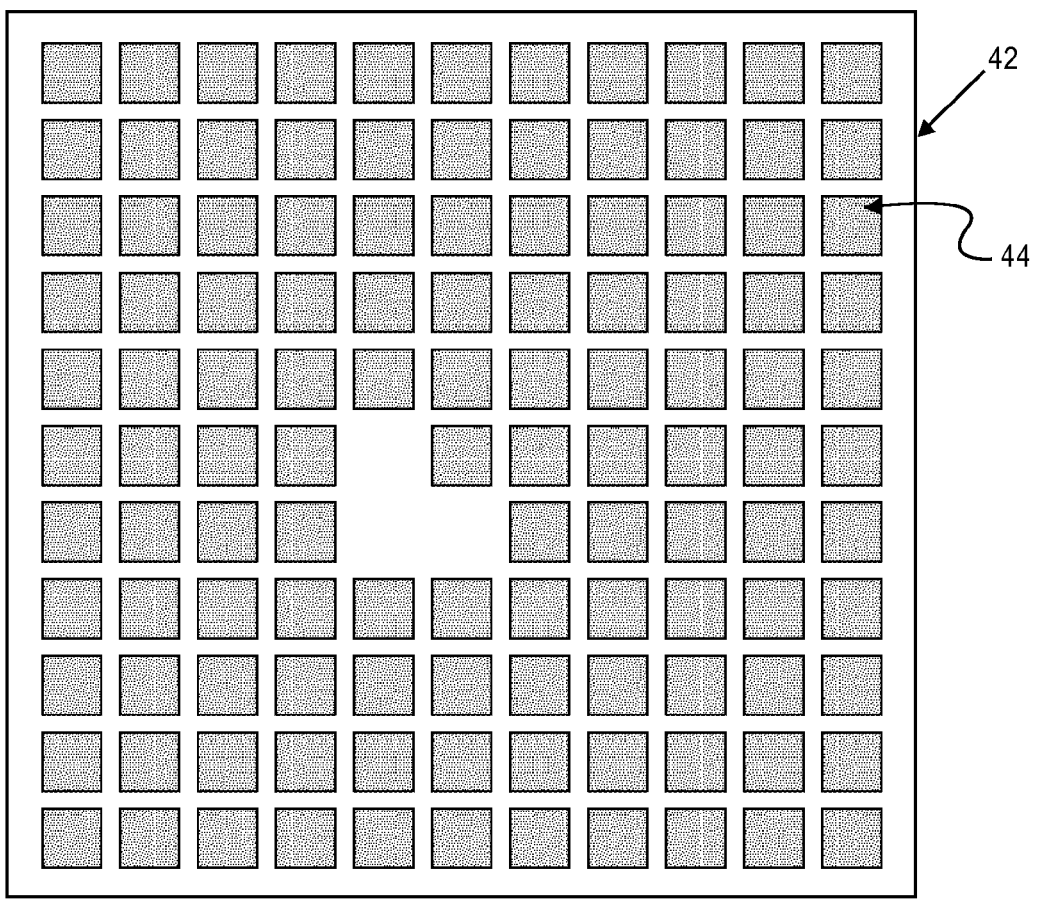
FIG. 2 illustrates a conventional layout of characters on a stencil.

In the second plate or stencil 22 there are various areas known as blanking area 36. Blanking area 36 is required around each character on the second plate 22. The blanking area 36 must be sufficiently large in order to block the electron beam 20 and most stray or scattered electrons from electron beam 20 shaped by aperture 18 so that no other adjacent aperture on stencil 22 allows electrons to pass through. If such electrons were to pass through, they would become a part of the electron beam 34 and print unwanted images on the surface 30. The amount of blanking area required is determined by the size of the character and the size of the aperture 18 and the degree and amount of anticipated scattering and straying of the electrons in electron beam 20. FIG. 2 illustrates a conventional design of a stencil. Typically, characters of a stencil 42 or an area of a stencil are arranged so that every character resides in a pre-designated CP area 44 of the stencil regardless of the size or shape of the character. Typically the CP areas, all of equal size, are arranged or placed in a grid-like pattern as illustrated in FIG. 2. The size of the CP areas is calculated so that the maximum allowable character can be accommodated. This arrangement or placement provides sufficient blanking area because of the fixed shape of the electron beam 20 striking the stencil 22. By contrast, in the present invention, the CP areas are customized for each stencil area in which a given set of characters is to reside. Additionally, because not every CP area is filled with a character of maximum size, the total amount of area occupied by two characters can be reduced by overlapping the blanking area of adjacent characters, as will be described more fully herein.

Figure 3:
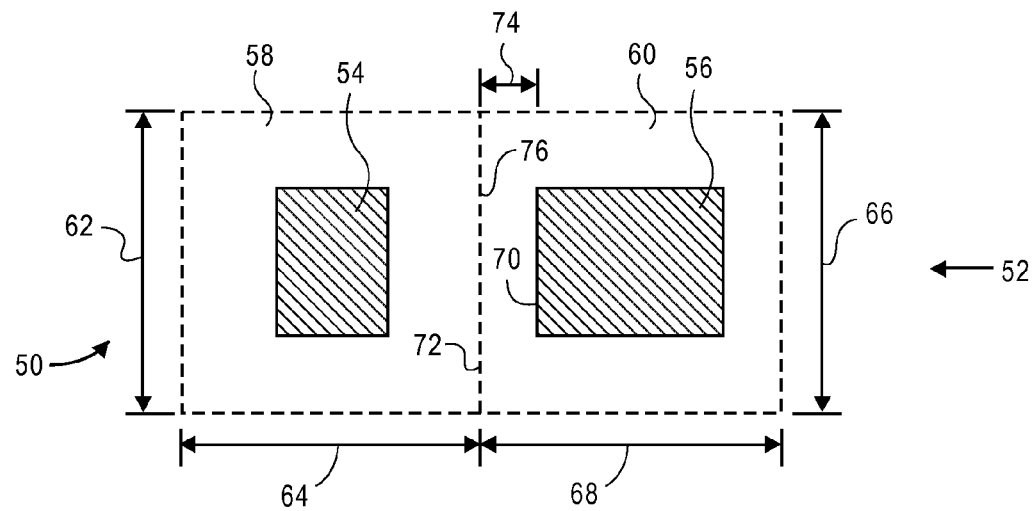
FIG. 3 illustrates a pair of conventional character projection characters.

FIG. 3 illustrates an example of a pair of conventional CP areas 50 and 52 that may be placed in the stencil 22. The CP area 50, which is outlined in dashed lines, encloses a character 54 through which the electron beam 20 is allowed to pass to be shaped into the electron beam 34. Likewise, the CP area 52, also outlined in dashed lines, encloses a character 56 that allows the electron beam 20 to pass through. The characters 54 and 56, which are rectangular in this example, are in the shape of desired patterns to be written to the surface 30. The CP area 50 also has a blanking area 58 that surrounds the character 54. The CP area 52 also has a blanking area 60 that surrounds the character 56. The CP area 50 has a length 62 and a width 64, and the CP area 52 has a length 66 and a width 68. Conventionally, the length 62 equals the length 66, and the width 64 equals the width 68. The character 56 has a left-most edge 70 and the CP area 50 has a right-most edge 72. A distance between the edges 70 and 72 is identified as 74 in FIG. 3. The CP area 52 also has a left-most edge 76 that coincides with the right-most edge 72 of CP area 50. The CP areas 50 and 52 are of a fixed size that is partially determined by the size of the aperture 18 in the plate 16. The combined width of the two CP areas 50 and 52 is the sum of width 64 and width 68. In this manner, the CP areas 50 and 52 have enough blanking areas 58 and 60, respectively. However, as discussed further herein, the blanking areas 58 and 60 together occupy more area than required, and more characters such as character 54 and character 56 can be fit on a stencil by sharing, reducing, or minimizing the blanking areas 58 and 60 between character 54 and character 56.

Figure 4:
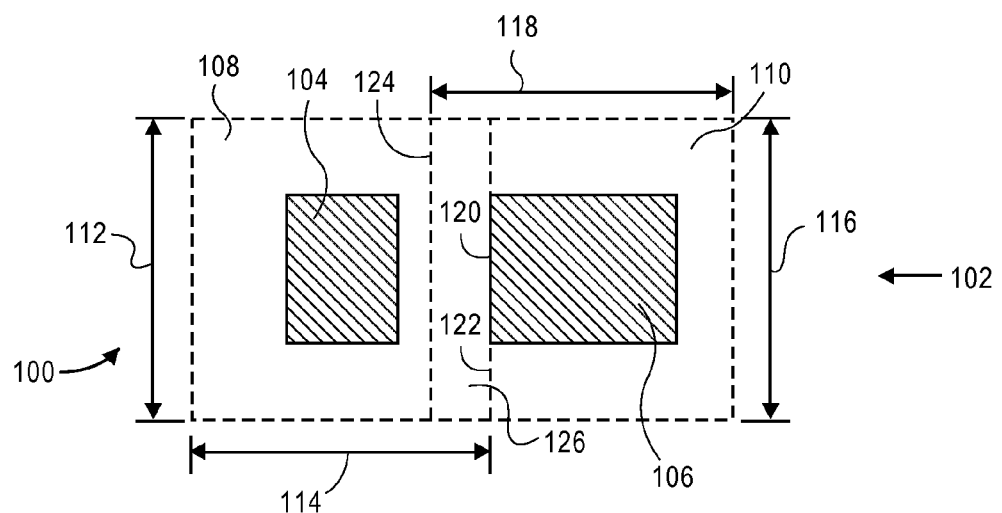
FIG. 4 illustrates a pair of character projection characters having horizontally-overlapped blanking regions, according to the current disclosure.

FIG. 4 illustrates an example of a pair of CP areas 100 and 102 which are relatively-oriented in a horizontal direction and which are designed according to the present disclosure. The CP area 100 encloses a character 104 through which an electron beam, such as the electron beam 20 may pass. The CP area 102 encloses a character 106. Character 104 and character 106 are in the shape of desired patterns, such as circuit patterns, to be written to the surface 30. In this example character 104 and character 106 are rectangular, but they may also be arbitrary-angled linear, circular, annular, part circular, part annular, or arbitrary curvilinear shapes, and may be a connected set of complex shapes or a group of disjointed sets of connected sets of complex shapes. The CP area 100 has a blanking area 108 that surrounds the character 104. The CP area 102 has a blanking area 110 that surrounds the character 106. The CP area 100 has a length 112 and a width 114 and the CP area 102 has a length 116 and a width 118. Like the conventional example of FIG. 3, the length 112 is equal to the length 116, and the width 114 is equal to the width 118. Unlike the conventional example of FIG. 3, however, the blanking area 110 is shared or overlapped with the blanking area 108. The combined width of the two CP areas 100 and 102 is therefore less than the sum of the width 114 and the width 118. Overlapping the blanking areas 108 and 110 reduces the combined area occupied by CP areas 100 and 102 as compared to the combined area occupied by the CP areas 50 and 52 shown in FIG. 3. The blanking areas 108 and 110 are being overlapped or shared in the horizontal direction. The character 106 has a left most edge 120 and the CP area 100 has a right-most edge 122, with the edge 120 and the edge 122 coinciding with each other. The CP area 102 has a left-most edge 124. An overlapped or shared blanking area portion 126 is between the CP area 100 edge 122 and the CP area 102 edge 124. The distance between the edges 122 and 124 corresponds to the distance 74 shown in FIG. 3. In essence the combined width of CP areas 100 and 102 has been reduced by the distance 74. In this manner, more characters may be placed in a horizontal orientation or position on the stencil 22. In this example the CP area 100 length 112 and the CP area 102 length 116 are equal. In other embodiments, the length 112 and the length 116 may be unequal.

Figure 5:
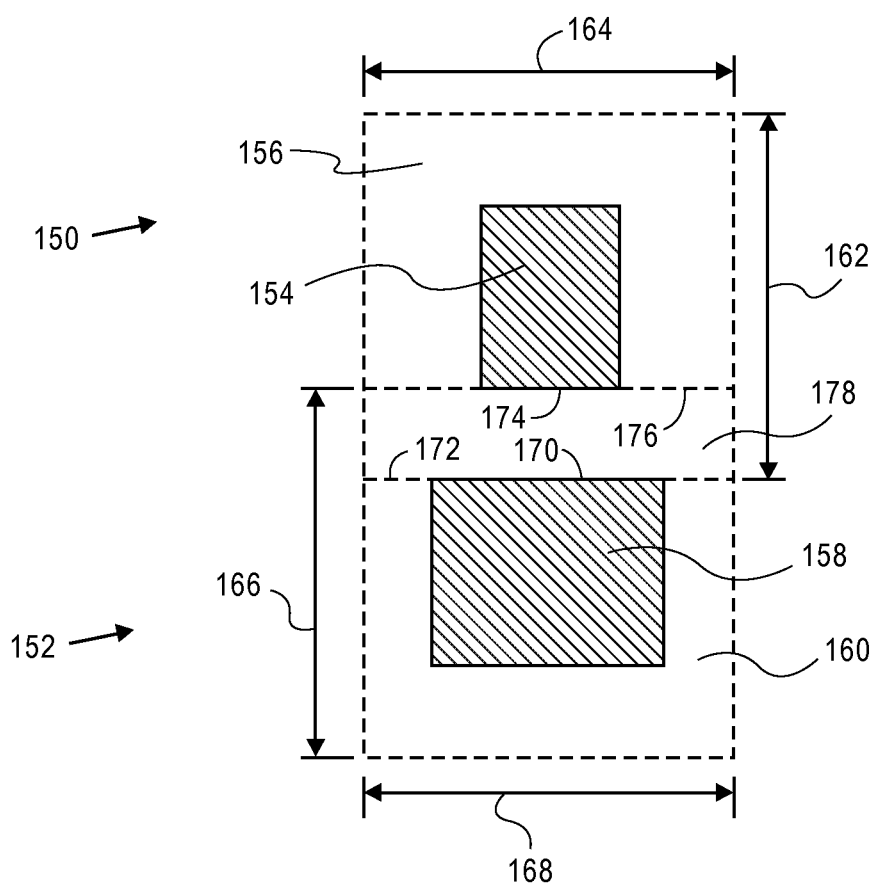
FIG. 5 illustrates a pair of character projection characters having vertically-overlapped blanking regions, according to the current disclosure.

FIG. 5 shows an example of a pair of CP areas 150 and 152 which are relatively-oriented in a vertical direction. The CP area 150 encloses a character 154 and a blanking area 156. The CP area 152 encloses a character 158 and a blanking area 160. The CP area 150 has a length 162 and a width 164, and the CP area 152 has a length 166 and a width 168. The width 164 equals the width 168. The length 162 equals the length 166. The blanking area 160 is being shared with the blanking area 156 and this reduces the combined area occupied by the CP areas 150 and 152 as compared to the combined area occupied by the CP areas 50 and 52 shown in FIG. 3. The blanking areas 156 and 160 are being overlapped or shared in the vertical direction. The character 158 has a top-most edge 170 and the CP area 150 has a bottom-most edge 172 with the edges 170 and 172 coinciding with each other. Similarly, the character 154 has a bottom-most edge 174, and the CP area 152 has a top-most edge 176 with the edge 174 and the edge 176 coinciding with each other. An overlapped or shared blanking area portion 178 is between the edge 172 and the edge 176. As can be appreciated, more characters may be placed in a vertical orientation or positioned on the stencil 22 by overlapping CP areas 150 and 152. In this example, the CP area 150 width 164 and the CP area 152 width 168 are equal. In other embodiments, the width 164 and the width 168 may be unequal.

Figure 6:
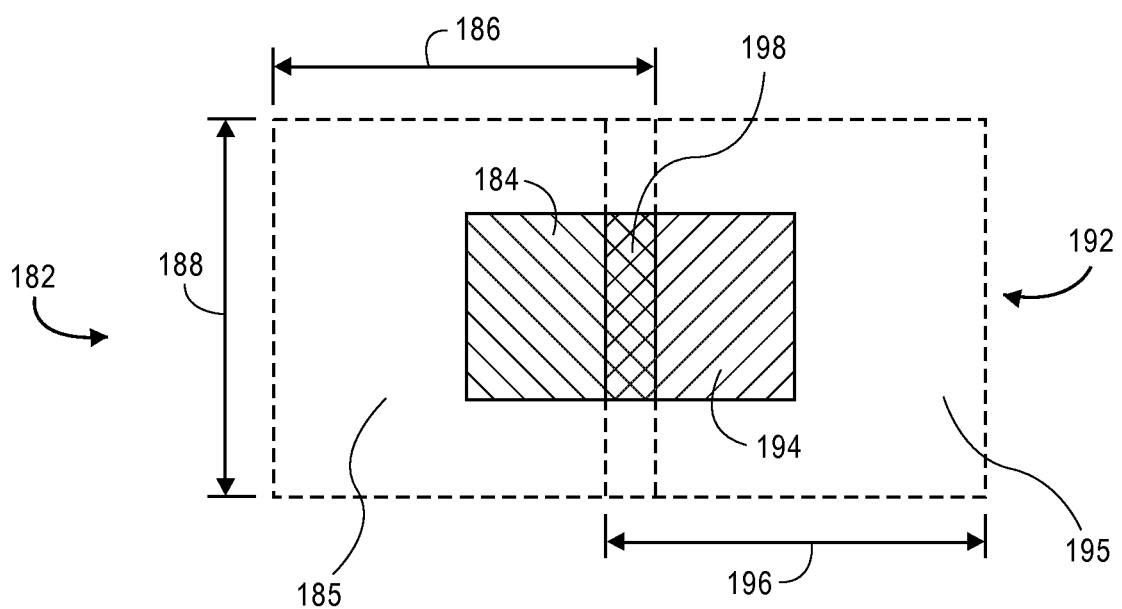
FIG. 6 illustrates a pair of character projection characters which overlap.

FIG. 6 illustrates an example of a pair of CP areas 182 and 192 which are relatively-oriented in a horizontal position and which are also designed according to this disclosure. The CP area 182 encloses a CP character 184 and a blanking area 185. The CP area 192 encloses a CP character 194 and a blanking area 195. The CP area 182 has a length 188 and a width 186. The CP area 192 has a length 188 and a width 196. As can be seen, the CP character 184 and the CP character 194 overlap in the region 198. As also can be seen, the blanking area 185 and the blanking area 195 also overlap. As can be seen, the combination of the CP area 182 and the CP area 192 as illustrated in FIG. 6 requires less combined area than if conventional techniques had been used.

Figure 7:
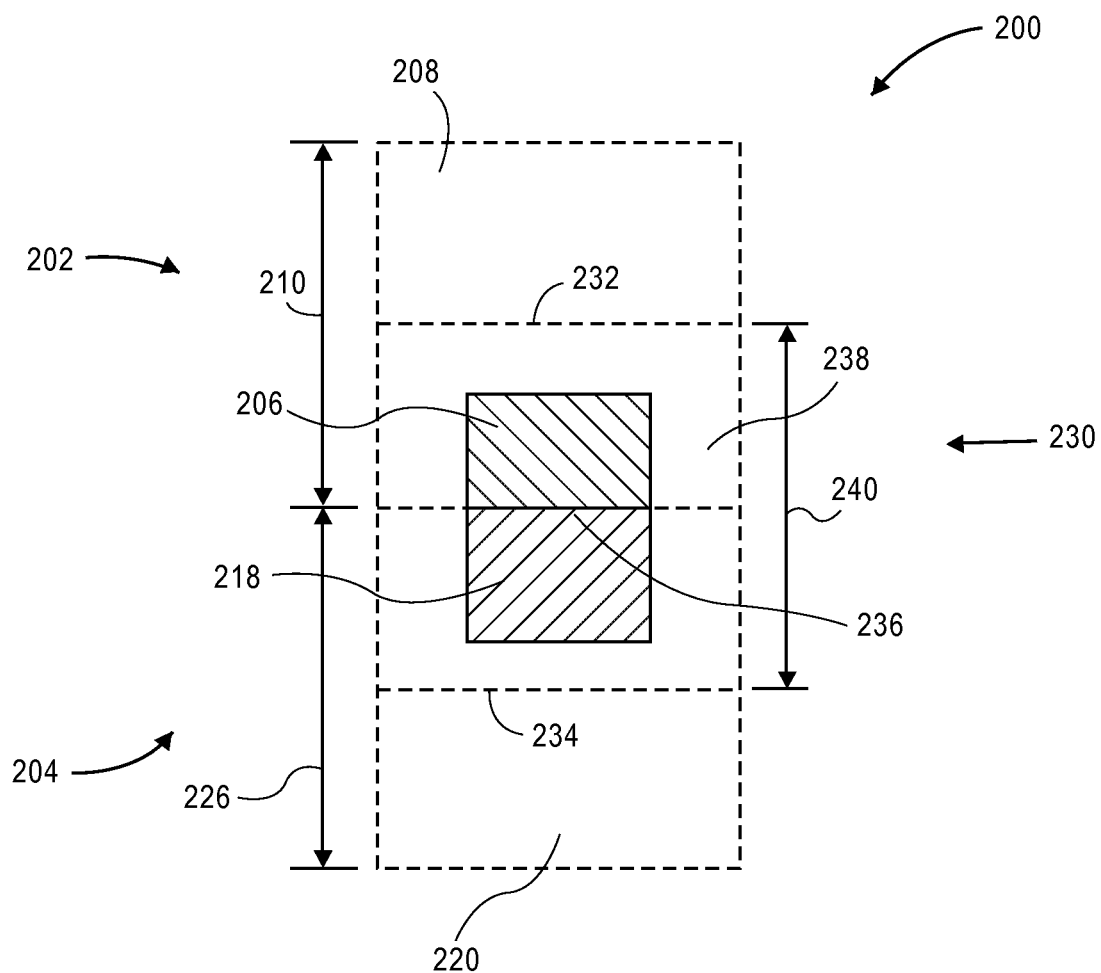
FIG. 7 illustrates two characters ganged together in the vertical direction.

FIG. 7 illustrates another embodiment 200 of how to increase character density on a stencil by ganging a first character 206 and a second character 218 together in a vertical orientation or direction. The CP area 202, which is outlined by dashed lines, encloses the character 206 and a blanking area 208. The CP area 202 has a length 210. The CP area 204, also outlined by dashed lines, encloses the character 218 and a blanking area 220. The CP area 204 has a length 226. A third CP area 230 is defined between edge 232 and edge 234. CP area 230 has a length 240. As can be seen, the CP area 230 overlaps the CP areas 202 and 204. The characters 206 and 218, when combined, form a character 236 of the third CP area 230. The third CP area 230 also has a blanking area 238. Blanking area 238 overlaps both the blanking area 208 and the blanking area 220.

By use of the embodiment 200 any of the three different characters 206, 218, and 236 may be written in one CP shot. For example, a first character 206 may be written onto a surface by illuminating CP area 202 with the electron beam 20, the second character 218 may be written onto the surface by illuminating CP area 204, and the third character 236, which is a combination of the characters 206 and 218, may be written onto the surface by illuminating CP area 230. In this manner, three characters may be formed in a stencil using less stencil area than conventionally required for two CP areas. CP areas can also be ganged together in a horizontal direction or orientation or in both the vertical and horizontal directions.

Variable character projection allows a portion of a CP character to be selectively shot. In particular, the electron beam 20, as illustrated in FIG. 1, can be directed so that a character such as character 26 is only partially overlapped by the electron beam 20. This provides the ability to selectively shoot portions of the character, as long as there is sufficient blanking area adjacent to the character so that the electron beam 20 does not illuminate any portion of an adjacent character. This results in a requirement for a variable-sized blanking area depending upon how much of a character needs to be exposed. In general, there will be some minimum portion of a character that must be exposed to obtain a usable circuit, and this minimal portion will define the maximum blanking area needed by the character. For example, by using variable character projection by moving the electron beam 20 so as to illuminate the CP area 202 as illustrated in FIG. 7, the character 206 will be shot on to a surface. The electron beam 20 can then be repositioned over the CP area 204 and the character 218 will be shot on to the surface. Also, the electron beam 20 can be positioned over the third CP area 230 to shoot the third character 236 on to the surface.

Figure 8:
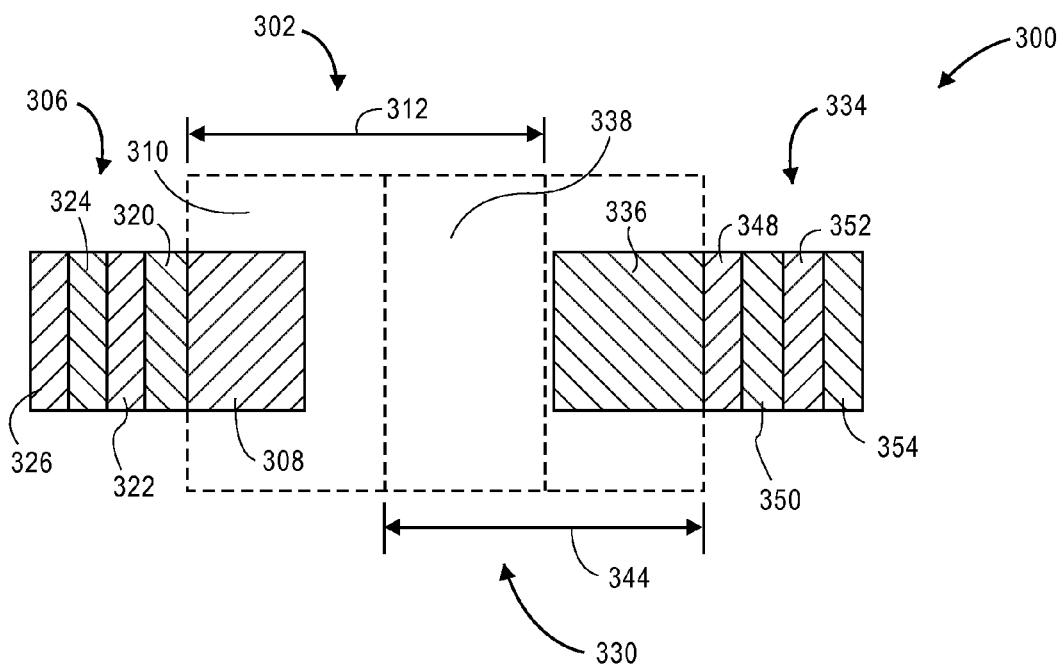
FIG. 8 illustrates a pair of standalone characters having horizontally-overlapped blanking regions, with a group of optional characters adjoining each standalone character.

FIG. 8 illustrates an example of another embodiment 300 of how to increase character density on a stencil. The embodiment 300 comprises a first CP area 302, outlined in dashed lines, which has a width 312. CP area 302 has a character 308 and a blanking area 310. The character 308 is standalone, meaning it can form a meaningful pattern on a surface when shot by itself. A set of optional characters 306 adjoins the standalone character 308. The set of optional characters 306 consists of characters 320, 322, 324 and 326. The sum of the width of the standalone character 308 and the optional characters 306 is less than or equal to width 312. The optional characters 320, 322, 324 and 326 may not form meaningful standalone patterns when shot without character 308. However, when the standalone character 308 and one or more characters in the set of optional characters 306 are shot together a meaningful pattern is formed on the surface. Characters 308 and 320 may be shot together. Characters 308, 320, and 322 may be shot together. Characters 308, 320, 322, and 324 may be shot together. Lastly, characters 308, 320, 322, 324, and 326 may be shot together in one CP shot. Variable character projection can be used to selectively shoot the aforementioned combinations of characters. In particular, the electron beam 20 can be positioned so as to illuminate the CP area 302. By moving the electron beam 20 laterally to the left, the standalone character 308 as well as one or more of the characters 320, 322, 324, and 326 can be illuminated, as is desired. As can be appreciated, no blanking area is needed on the side of the standalone character 308 which abuts the set of optional characters 306. In this example, blanking area is needed above, below and on the right side of standalone character 308.

The embodiment 300 also comprises a second CP area 330, also outlined in dashed lines, which has a width 344. The CP area 330 has a standalone character 336 and a blanking area 338. The blanking area 338 overlaps the blanking area 310. A set of optional characters 334 adjoins the standalone character 336. The set of optional characters 334 consists of characters 348, 350, 352 and 354. The standalone character 336 when shot by itself can form a meaningful pattern on the surface. The characters in the set of optional characters 334 may not create meaningful patterns when shot by themselves, and therefore do not need to be shot alone. However, when the standalone character 336 and one or more characters in the set of optional characters 334 are shot together a meaningful pattern is formed on the surface. The standalone character 336 may be written by positioning the electron beam 20 to illuminate or shoot CP area 330. Again, by using variable character projection the electron beam 20 may be moved laterally to the right so as to illuminate the standalone character 336 and one or more of the characters 348, 350, 352 and 354. Each of the combinations of standalone character 336 and one or more of the characters 348, 350, 352 and 354 can form a meaningful pattern on the surface. As with CP area 302, no blanking area is needed on the side of the standalone character 336 which abuts the set of optional characters 334. To summarize, embodiment 300 illustrates how stencil area may be efficiently utilized by combining a standalone character with one or more adjacent optional characters, so that combinations of the standalone character and one or more optional characters may be used to form a plurality of patterns on the surface.

Figure 9:
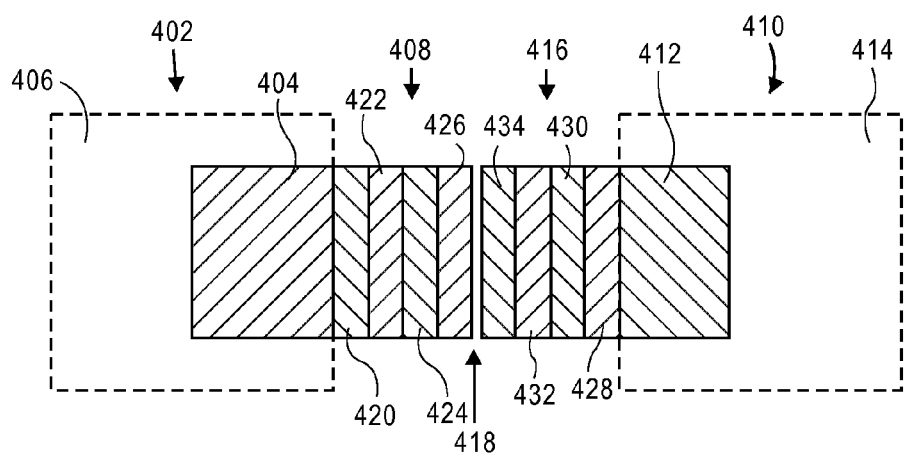
FIG. 9 illustrates another arrangement of a pair of standalone characters, each with a group of optional characters.

FIG. 9 illustrates an example of another embodiment 400 of how to increase character density on a stencil. The embodiment 400 comprises a first CP area 402, outlined in dashed lines, which has a standalone character 404 and blanking area 406. A set or group of optional characters 408 adjoins the standalone character 404. The group of optional characters 408 consists of optional characters 420, 422, 424 and 426. Embodiment 400 additionally comprises a second CP area 410, also outlined in dashed lines, which has a standalone character 412 and a blanking area 414. A set or group of optional characters 416 adjoins the standalone character 412. The group of optional characters 416 consists of optional characters 428, 430, 432, and 434. Since none of the characters in the sets of optional characters 408 and 416 ever needs to be exposed without the standalone characters 404 or 412, the optional character 426 needs only minimum blanking area 418 to its right and the optional character 434 needs only minimum blanking area 418 to its left. In view of this, blanking area is saved, reduced, or minimized by placing the CP area 402 and its associated group of optional characters 408 side by side with CP area 410 and its associated group of optional characters 416. In locating optional character group 408 as close as possible to optional character group 416, it is contemplated that optional character group 408 does not touch optional character group 416 and rather there is an intervening blanking area 418. The blanking area 406 required for the standalone character 404 can be shared with blanking area from another CP cell that is placed to the left of the CP area 402, as has been previously described and discussed. Also, the blanking area 414 required for the standalone character 412 can be shared with blanking area from another CP area that is positioned to the right of the CP area 410. As can be appreciated, the optional character group 408 may comprise various characters 420, 422, 424 and 426 that can be selectively shot in combination with the standalone character 404 to form various patterns on a surface by use of variable character projection. Standalone character 404, when shot by itself, may form the pattern of a first circuit, and standalone character 404 shot in combination with one or more of characters in the optional character group 408 may form the pattern of a second circuit. Also, the optional character group 416 may comprise various characters 428, 430, 432, and 434 that can be selectively shot in combination with the standalone character 412 to form various patterns on the surface by use of variable character projection. Standalone character 412, when shot by itself, may form the pattern of a third circuit, and standalone character 412 shot in combination with one or more characters in the optional character group 416 may form the pattern of a fourth circuit.

Figure 10:
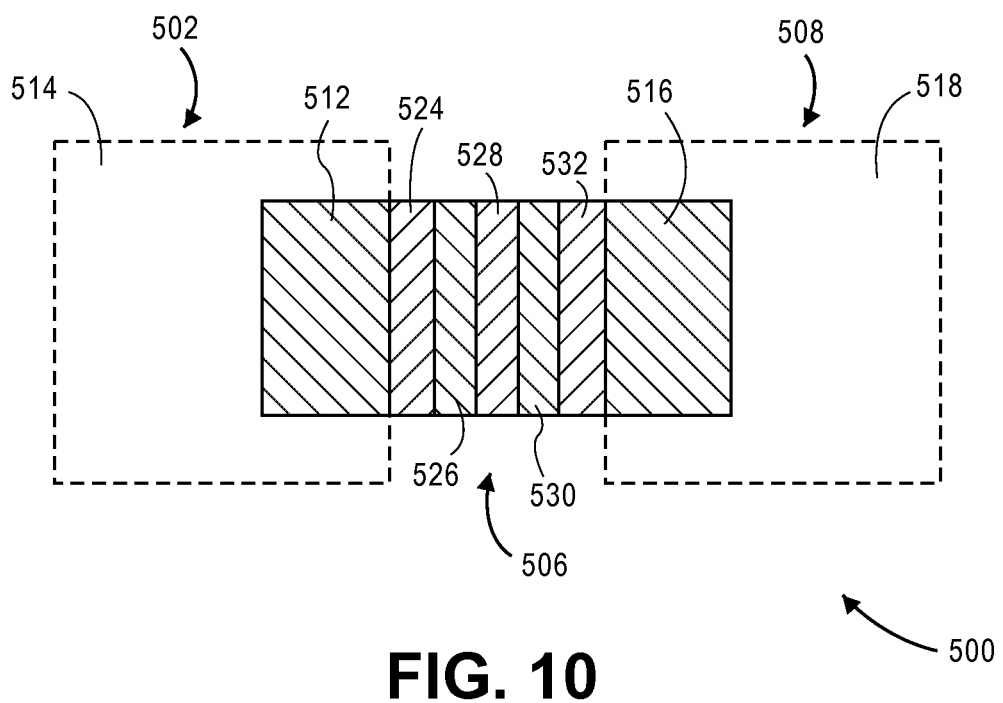
FIG. 10 illustrates a pair of standalone characters which share a group of optional characters.

FIG. 10 illustrates an example of another embodiment 500 of how to increase the character density on a stencil is shown. The embodiment 500 comprises a first CP area 502, outlined in dashed lines, having a first standalone character 512 and a blanking area 514, and a second CP area 508, also outlined in dashed lines, having a second standalone character 516 and a blanking area 518. Additionally, a set of optional characters 506 is arranged to be adjacent to both the first standalone character 512 and the second standalone character 516. The set of optional characters 506 comprises characters 524, 526, 528 530 and 532. By positioning the electron beam 20 to illuminate the CP area 502, standalone character 512 may be projected onto a surface. By adjusting the electron beam 20 to the right, one or more characters in the set of optional characters 506 may be projected onto the surface in combination with standalone character 512. Similarly, by positioning the electron beam 20 to illuminate the CP area 508, standalone character 516 may be projected onto the surface. By adjusting the electron beam 20 to the left, one or more characters in the set of optional characters 506 may be projected onto the surface in combination with standalone character 516. The set of optional characters 506 is thusly usable in combination with either of the standalone characters 512 or 516. The total stencil area required for CP areas 502 and 508 and the optional characters 506 is reduced by sharing the optional characters 506, compared to if characters 512 and 516 were arranged separately, each with a separate set of optional characters. The character 512, when shot by itself, may form the pattern of a first circuit. The character 512 shot in combination with one or more characters in the set of optional characters 506 may form the pattern of a second circuit. Similarly, the character 516, when shot by itself, may form the pattern of a third circuit. The character 516 shot in combination with one or more characters in the set of optional characters 506 may form the pattern of a fourth circuit.

In an embodiment of this invention, where an electrical circuit is being written on the surface, the surface being of either a wafer or other substrate, or the surface being of a reticle which will be used in an optical lithography process, some circuits or patterns may be designed to have fixed length characters so that power and ground shapes or other shapes in multiple characters can be designed to abut by connection either vertically, horizontally, or in both directions. This requires that a subset of the characters on the stencil have a common length or a common width.

Figure 11:
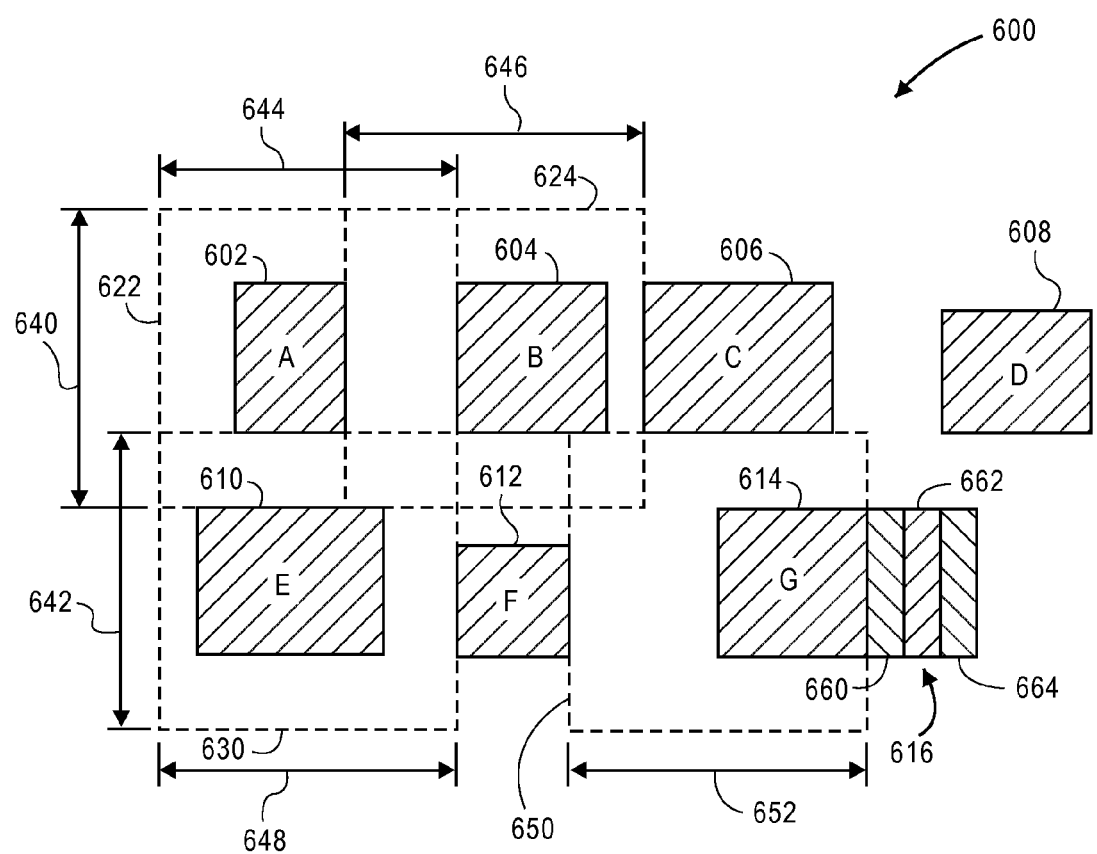
FIG. 11 illustrates a group of characters arranged into two rows.

FIG. 11 illustrates an example of a stencil arrangement 600 in which CP characters, many of which are the same length, are arranged into rows. In this example, there are two rows of characters. The upper row contains four characters: character 602, character 604, character 606 and character 608. The lower row contains three standalone characters: character 610, character 612 and character 614. Adjacent to character 614 is a set of optional characters 616 consisting of character 660, character 662 and character 664. Note that the lengths of characters 608 and 612 are less than the lengths of characters 602, 604, 606, 610, 614, 660, 662 and 664, all of which are of equal length. CP areas in dashed lines are shown for characters 602, 604, 610 and 614. The character 602 CP area 622 has a length 640 and a width 644. The character 604 CP area 624 has a length 640 and a width 646. The character 610 CP area 630 has a length 642 and a width 648. As can be seen, the blanking area around character 610 in CP area 630 overlaps both the blanking area around character 602 in CP area 622 and the blanking area around character 604 in CP area 624. The character 614 CP area 650 has a length 642 and a width 652. As can be seen, the character 614 blanking area within CP area 650 does not extend to the right of character 614, because of the adjacent set of optional characters 616. Stencil arrangement 600 shows how a group of characters, some having equal length and others having different length, can be arranged in rows such that the character blanking areas overlap both within a row and between rows. A stencil may be similarly designed with the characters arranged in overlapping columns, rather than rows. In an embodiment where each standalone character represents a pattern for a standard cell, it is common for a plurality of standard cells to be designed to have the same length. The characters designed to write patterns for these standard cells on a surface may therefore also be of the same length.

Figure 12:
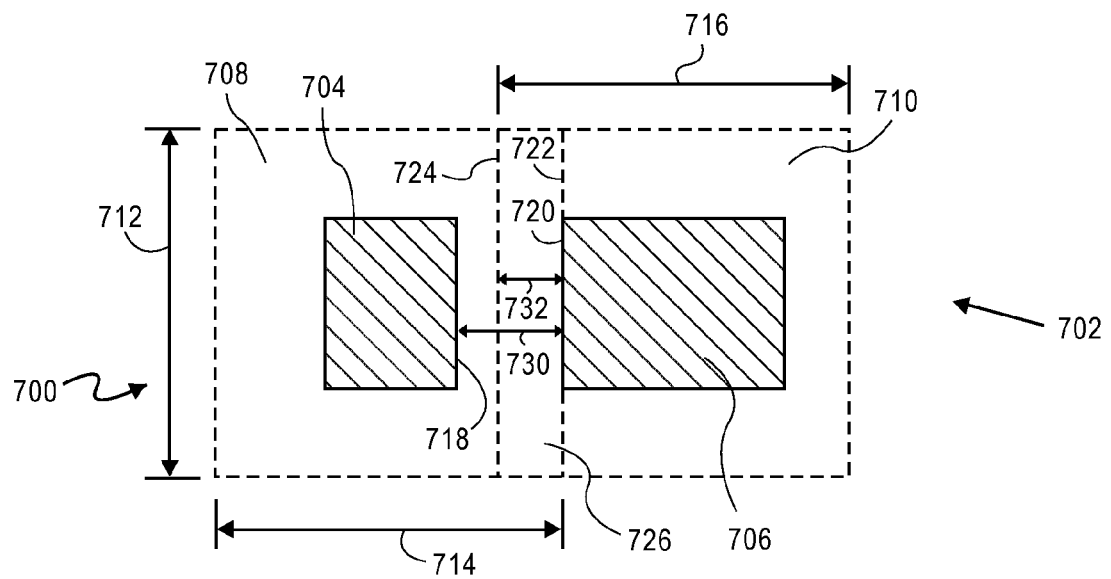
FIG. 12 illustrates a pair of character projection characters having horizontally-overlapped blanking regions.

FIG. 12 illustrates another example of overlapping CP areas. CP area 700 encloses character 704 and blanking area 708. CP area 702 encloses character 706 and blanking area 710. CP area 700 has length 712 and width 714. CP area 702 has length 712 and width 716. The right-most edge of CP area 700 is 722, and the left-most edge of CP area 702 is 724. The right-most edge of character 704 is 718 and the left-most edge of character 706 is 720. The area where blanking area 708 overlaps blanking area 710 is labeled 726. As can be seen, edge 722 of CP area 700 coincides with left-most edge 720 of character 706. The maximum right-side overlap of blanking area 708 is 730, which is also the right-side blanking requirement of CP area 708. The maximum left-side overlap of blanking area 710 is 732, which is also the left-side blanking requirement of CP area 702. As can be seen, in this example the maximum left-size overlap 732 of blanking area 710 is less than the maximum right-side overlap 730 of blanking area 708. Thus, distance 732 limits the amount of overlap that can be obtained between CP area 700 and CP area 702 when in the relative configuration of FIG. 12. When determining the placement of a plurality of CP areas on a stencil, the maximum blanking area overlap between any pair of adjacent CP areas can be obtained by placing each of the plurality of CP areas such that adjacent CP areas have similar blanking space requirements on their adjacent sides.

A bin packing algorithm may be used to determine the maximum number of characters which fit into a row or column. One special form of the bin packing algorithm is called a 2D packing algorithm which is used to find the arrangement of items that best fits within a prescribed area. As applied to packing CP characters on a stencil, a 2D packing algorithm would find the arrangement of CP characters that best fits within a predetermined stencil area. Inputs for this algorithm would be sizing aspects in one or more orthogonal dimensions (e.g., the length and width of each CP character), the blanking requirement on each side (left-side, top-side, right-side and bottom-side), and the fact that blanking areas may overlap each other. As has been discussed herein, this could involve fixed-length cells with variable width or fixed-width cells with variable length.

Figure 13:
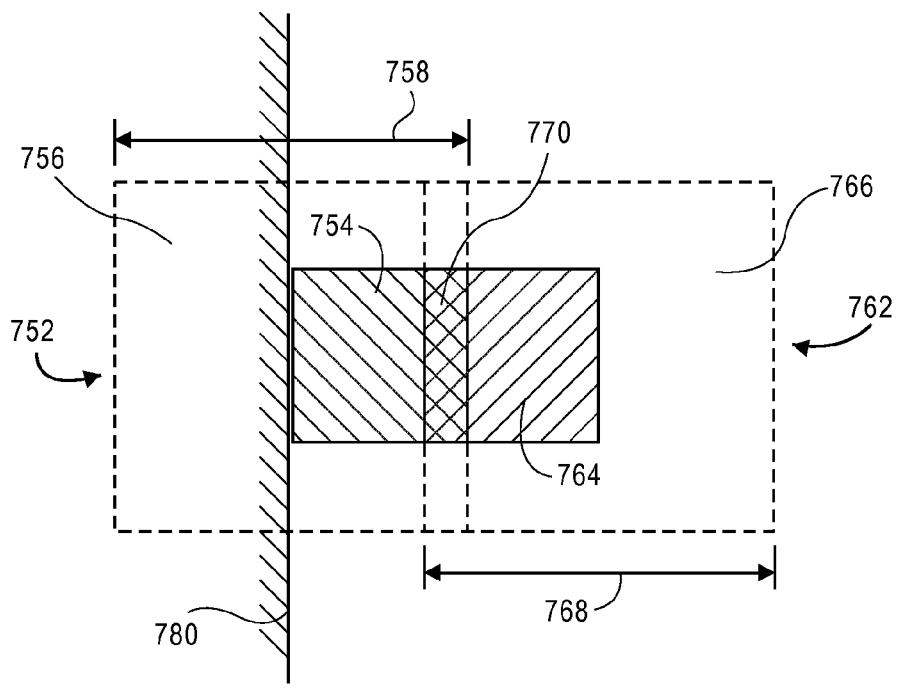
FIG. 13 illustrates a pair of character projection characters, where the blanking area for one character overlaps the boundary of the stencil's available character area.

FIG. 13 illustrates an example of another method for reducing stencil blanking area requirements. CP area 752 encloses a character 754 and a blanking area 756. CP area 762 encloses a character 764 and a blanking area 766. CP area 752 is of width 758 and CP area 762 is of width 768. As can be seen, characters 754 and 764 overlap each other in area 770. Because the character 754 is positioned on the right-most side of CP area 752, the right-side blanking requirement for CP area 752 is zero. The left-side blanking requirement is the width 758 of CP area 752 minus the width of the character 754. Line 780 represents a portion of the left boundary of the stencil area 42 on which available characters may be placed. The shading on the left side of line 780 is to indicate that characters can be placed on the right side of line 780 only. As can be seen, blanking area 756 overlaps the boundary 780. By placing the CP character 754 at or near the edge of the stencil's available character area 780, the blanking area requirement within the stencil's available character area is reduced. This technique requires that the area surrounding the available character area—i.e. the area to the left of boundary 780—must block the electron beam 20. The most blanking area can be saved by maximizing, for the configuration of FIG. 13, the left-side blanking requirement of characters placed at the left boundary of the stencil's available character area 780. Similarly, characters may be placed on the stencil so that blanking areas overlap the boundary of the stencil's available character area in other directions. This technique can also be used when the stencil's available character area is other than the rectilinear shape 42 shown in FIG. 2. For example a character may be placed so as to overlap the blanking area for the character with a circular boundary of an available character area of a stencil.

As the above has indicated, in order to reduce shot count, the design of a pattern must be able to be written onto a surface, as much as possible, using CP shots. When a character is not available for part of the pattern, that part of the pattern must be written by individual VSB shots, which significantly increases the shot count compared to using a CP character. It is therefore desirable that CP shots be used for writing as much of the pattern as possible, thereby minimizing VSB shots. The more characters that can be placed on a stencil, the fewer VSB shots will be required to complete writing the pattern. However, the stencil and the stencil's available character area, that is the stencil area in which a character can be chosen with only the deflection of the electron beam 20 and without physically moving the stencil plate 22, is limited in size, and only a certain number of characters can be placed within the stencil's available character area. Thus, it would be advantageous to be able to increase the number of characters that can be placed within a stencil's available character area.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present stencil having improved cell density for character projection lithography may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A stencil for charged particle beam lithography comprising:
    a first character projection (CP) character having an adjacent first blanking area, wherein the first blanking area is large enough to permit illumination of a minimum desired portion of the first CP character with a charged particle beam without illuminating another character, wherein dimensions of the charged particle beam illuminating the stencil are determined by a charged particle beam system, wherein the charged particle beam system comprises a charged particle beam source and a first aperture plate, and wherein the first aperture plate is the only aperture plate between the charged particle beam source and the stencil; and
    a second CP character having an adjacent second blanking area, wherein the second blanking area is large enough to permit illumination of a minimum desired portion of the second CP character with the charged particle beam without illuminating another character, and
    wherein at least a portion of the first blanking area overlaps the second blanking area, and
    wherein the first character, the first blanking area, the second character and the second blanking area combined comprise less than three times the size of the illuminating charged particle beam in at least one of the x or y dimensions.

2. The stencil of claim 1 wherein the first and second CP characters are relatively-oriented in a horizontal position.

3. The stencil of claim 1 wherein the first and second CP characters are relatively-oriented in a vertical position.

4. The stencil of claim 1 wherein the first CP character comprises a first circuit pattern and wherein the second CP character comprises a second circuit pattern.

5. The stencil of claim 1 wherein the first CP character partially overlaps the second CP character.

6. The stencil of claim 1 wherein a set of one or more optional CP characters adjoins the first CP character, and wherein the first CP character in combination with at least one character in the set of optional CP characters can form the pattern of a circuit on a surface.

7. A method of designing a stencil for charged particle beam lithography comprising the steps of:
    determining fixed dimensions for a charged particle beam to be used to illuminate the stencil;
    placing a first character projection (CP) character in the stencil, the first CP character having an adjacent first blanking area, wherein the first blanking area is large enough to permit illumination of a minimum desired portion of the first CP character with a charged particle beam without illuminating another character; and
    placing a second CP character in the stencil, the second CP character having an adjacent second blanking area, wherein the second blanking area is large enough to permit illumination of a minimum desired portion of the second CP character with the charged particle beam without illuminating another character, wherein the second blanking area overlaps at least a portion of the first blanking area, wherein the first character, the first blanking area, the second character and the second blanking area combined comprise less than three times the size of the charged particle beam to be used to illuminate the stencil.

8. The method of claim 7 wherein the first and second CP characters are relatively-oriented in a horizontal position.

9. The method of claim 7 wherein the first and second CP characters are relatively-oriented in a vertical position.

10. The method of claim 7 wherein the first CP character can form the pattern of a first circuit on a surface and the second CP character can form the pattern of a second circuit on the surface.

11. The method of claim 10 wherein the first CP character partially overlaps the second CP character.

12. The method of claim 7 further comprising placing a set of one or more optional CP characters adjacent to the first CP character in the stencil.

* * * * *

UNITED STATES PATENT AND TRADEMARK OFFICE
CERTIFICATE OF CORRECTION

PATENT NO. : 8,426,832 B2  
APPLICATION NO. : 12/552373  
DATED : April 23, 2013  
INVENTOR(S) : Yoshida et al.

Page 1 of 1

It is certified that error appears in the above-identified patent and that said Letters Patent is hereby corrected as shown below:

On the Title Page, Item (54) and in the Specification, Column 1, line 1, Title should read:

--STENCIL DESIGN AND METHOD FOR IMPROVING CHARACTER DENSITY FOR-- CELL PROJECTION CHARGED PARTICLE BEAM LITHOGRAPHY

Signed and Sealed this  
First Day of October, 2013

Teresa Stanek Rea  
*Deputy Director of the United States Patent and Trademark Office*